(12) United States Patent
Yap et al.

(10) Patent No.: US 9,299,670 B2
(45) Date of Patent: Mar. 29, 2016

(54) STACKED MICROELECTRONIC PACKAGES HAVING SIDEWALL CONDUCTORS AND METHODS FOR THE FABRICATION THEREOF

(71) Applicants: Weng F. Yap, Phoenix, AZ (US); Michael B. Vincent, Chandler, AZ (US); Jason R. Wright, Chandler, AZ (US)

(72) Inventors: Weng F. Yap, Phoenix, AZ (US); Michael B. Vincent, Chandler, AZ (US); Jason R. Wright, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/829,737

(22) Filed: Mar. 14, 2013

(65) Prior Publication Data
US 2014/0264945 A1 Sep. 18, 2014

(51) Int. Cl.
*H01L 23/28* (2006.01)
*H01L 23/00* (2006.01)
(Continued)

(52) U.S. Cl.
CPC .............. *H01L 24/05* (2013.01); *H01L 24/24* (2013.01); *H01L 24/25* (2013.01); *H01L 24/82* (2013.01); *H01L 24/92* (2013.01); *H01L 24/96* (2013.01); *H01L 25/0657* (2013.01); *H01L 25/50* (2013.01); *H01L 21/561* (2013.01); *H01L 21/565* (2013.01); *H01L 23/5389* (2013.01); *H01L 24/83* (2013.01); *H01L 2224/0345* (2013.01); *H01L 2224/0346* (2013.01); *H01L 2224/04105* (2013.01); *H01L 2224/05548* (2013.01); *H01L 2224/05567* (2013.01); *H01L 2224/05647* (2013.01); *H01L 2224/06182* (2013.01); *H01L 2224/244* (2013.01); *H01L 2224/245* (2013.01); *H01L 2224/24011* (2013.01); *H01L 2224/24105* (2013.01); *H01L 2224/24147* (2013.01); *H01L 2224/2518* (2013.01); *H01L 2224/25175* (2013.01); *H01L 2224/2919* (2013.01);
(Continued)

(58) Field of Classification Search
CPC ....... H01L 23/488; H01L 24/18; H01L 21/50; H01L 24/05; H01L 25/50; H01L 23/5389; H01L 24/83; H01L 25/0657; H01L 24/25; H01L 2225/06524; H01L 2225/06558
USPC .......... 257/777, E21.505, E23.169, 686, 774, 257/787; 438/109, 113, 127, 637
See application file for complete search history.

(56) References Cited

U.S. PATENT DOCUMENTS 4,866,501 A 9/1989 Shanfield
5,019,946 A 5/1991 Eichelberger et al.
(Continued)

OTHER PUBLICATIONS

Notice of Allowance mailed May 19, 2015 for U.S. Appl. No. 13/591,924, 8 pages.
(Continued)

*Primary Examiner* — Jarrett Stark
*Assistant Examiner* — Shahed Ahmed

(57) ABSTRACT

A stacked microelectronic package can comprise a package body having an external vertical package sidewall, a plurality of microelectronic devices embedded within the package body, and package edge conductors electrically coupled to the plurality of microelectronic devices and extending to the external vertical package sidewall. A cavity is formed on an external surface of the package body between a first one of the package edge conductors and a second one of the package edge conductors. Electrically conductive material is in the cavity and in electrical contact with a first and a second one of the package edge conductors, wherein the conductive material in the cavity is within planform dimensions of the microelectronic package.

20 Claims, 7 Drawing Sheets

(51) Int. Cl.
*H01L 25/065* (2006.01)
*H01L 25/00* (2006.01)
*H01L 21/56* (2006.01)
*H01L 23/538* (2006.01)

(52) U.S. Cl.
CPC .......... *H01L2224/32145* (2013.01); *H01L 2224/73267* (2013.01); *H01L 2224/82039* (2013.01); *H01L 2224/82101* (2013.01); *H01L 2224/82365* (2013.01); *H01L 2224/92244* (2013.01); *H01L 2224/96* (2013.01); *H01L 2225/06524* (2013.01); *H01L 2225/06551* (2013.01); *H01L 2225/06558* (2013.01); *H01L 2924/12042* (2013.01); *H01L 2924/1461* (2013.01)

(56) References Cited

U.S. PATENT DOCUMENTS

| | | |
|---|---|---|
| 5,279,991 A | 1/1994 | Minahan et al. |
| 5,432,729 A | 7/1995 | Carson et al. |
| 5,465,186 A | 11/1995 | Bajorek et al. |
| 5,675,180 A | 10/1997 | Pedersen et al. |
| 5,847,448 A | 12/1998 | Val et al. |
| 5,977,640 A | 11/1999 | Bertin et al. |
| 6,467,880 B2 | 10/2002 | Rhodes |
| 6,560,109 B2 | 5/2003 | Yamaguchi et al. |
| 6,607,941 B2 | 8/2003 | Prabhu et al. |
| 6,674,159 B1 | 1/2004 | Peterson |
| 6,818,977 B2 | 11/2004 | Poo et al. |
| 6,822,191 B2 | 11/2004 | De Steur et al. |
| 6,855,572 B2 | 2/2005 | Jeung et al. |
| 7,394,152 B2 | 7/2008 | Yu et al. |
| 7,560,215 B2 | 7/2009 | Sharma et al. |
| 7,605,457 B2 | 10/2009 | Hoshino |
| 7,723,159 B2 | 5/2010 | Do et al. |
| 7,732,907 B2 | 6/2010 | Han et al. |
| 7,741,156 B2 | 6/2010 | Pagaila et al. |
| 7,759,800 B2 | 7/2010 | Rigg et al. |
| 7,829,998 B2 | 11/2010 | Do et al. |
| 7,838,979 B2 | 11/2010 | Oh |
| 7,843,046 B2 | 11/2010 | Andrews et al. |
| 7,951,649 B2 | 5/2011 | Val |
| 7,972,650 B1 | 7/2011 | Church et al. |
| 7,994,621 B2 | 8/2011 | Kim |
| 8,012,802 B2 | 9/2011 | Sasaki et al. |
| 8,030,179 B2 | 10/2011 | Hoshino |
| 8,134,229 B2 | 3/2012 | Sasaki |
| 8,247,268 B2 | 8/2012 | Do et al. |
| 8,362,621 B2 | 1/2013 | Lee et al. |
| 8,796,561 B1 | 8/2014 | Scanlan et al. |
| 2002/0121702 A1 | 9/2002 | Higgins, III |
| 2003/0138610 A1 | 7/2003 | Tao |
| 2006/0043569 A1 | 3/2006 | Benson et al. |
| 2008/0274603 A1* | 11/2008 | Do .......... H01L 21/76898 438/462 |
| 2009/0039528 A1 | 2/2009 | Haba et al. |
| 2009/0134527 A1* | 5/2009 | Chang .......... H01L 24/25 257/777 |
| 2009/0160065 A1 | 6/2009 | Haba et al. |
| 2009/0230533 A1 | 9/2009 | Hoshino et al. |
| 2010/0001407 A1 | 1/2010 | Krause et al. |
| 2010/0140811 A1 | 6/2010 | Leal et al. |
| 2010/0270668 A1 | 10/2010 | Marcoux |
| 2010/0320584 A1 | 12/2010 | Takano |
| 2011/0012246 A1 | 1/2011 | Andrews, Jr. et al. |
| 2011/0037159 A1 | 2/2011 | Mcelrea et al. |
| 2011/0304011 A1 | 12/2011 | Lee |
| 2012/0119385 A1 | 5/2012 | Co et al. |
| 2012/0187577 A1* | 7/2012 | Cordes .......... H01L 21/6835 257/777 |
| 2012/0193785 A1 | 8/2012 | Lin et al. |
| 2012/0313209 A1 | 12/2012 | Oganesian |
| 2013/0010441 A1 | 1/2013 | Oganesian et al. |
| 2013/0049225 A1* | 2/2013 | Kang .......... H01L 21/76898 257/774 |
| 2014/0054783 A1 | 2/2014 | Gong et al. |
| 2014/0054797 A1* | 2/2014 | Gong .......... H01L 23/49805 257/777 |

OTHER PUBLICATIONS

Final Office Action mailed May 12, 2015 for U.S. Appl. No. 13/906,621, 11 pages.
U.S. Appl. No. 13/591,990, Vincent, M.B., et al., "Stacked MicroElectronic Packages Having Sidewall Conductors and Methods for the Fabrication Thereof", filed Aug. 22, 2012.
U.S. Appl. No. 13/591,924, Gong, Z., et al., Stacked Microelectronic Packages Having Sidewall Conductors and Methods for theFabrication Thereof, filed Aug. 22, 2012.
U.S. Appl. No. 13/591,969, Gong, Z., et al., "Stacked Microelectronic Packages Having Patterned Sidewall Conductors and Methods for the Fabrication Thereof", filed Aug. 22, 2012.
Notice of Allowance mailed Apr. 2, 2015 for U.S. Appl. No. 13/591,969, 8 pages.
Non-Final Office Action mailed Mar. 6, 2015 for U.S. Appl. No. 13/591,924, 8 pages.
Notice of Allowance mailed Feb. 17, 2015 for U.S. Appl. No. 13/591,990, 5 pages.
Notice of Allowance mailed Mar. 5, 2015 for U.S. Appl. No. 14/042,623, 14 pages.
Non-Final Office Action mailed May 22, 2015 for U.S. Appl. No. 14/097,424, 13 pages.
Rabaey, J. et al., "Digital Integrated Circuits", Jan. 2003, Pearson Education, 2nd Ed. 38-40.
Restriction Requirement mailed Apr. 11, 2014 for U.S. Appl. No. 13/591,924, 9 pages.
Non-Final Office Action mailed Jul. 24, 2014 for U.S. Appl. No. 13/591,924,16 pages (892).
Final Office Action mailed Nov. 19, 2014 for U.S. Appl. No. 13/591,924, 21 pages.
Non-Final Office Action mailed Sep. 13, 2013 for U.S. Appl. No. 13/591,969, 18 pages.
Final Office Action mailed Feb. 14, 2014 for U.S. Appl. No. 13/591,969 16 pages.
Final Office Action mailed Sep. 22, 2014 for U.S. Appl. No. 13/591,969 17 pages.
Notice of Allowance mailed Jan. 28, 2015 for U.S. Appl. No. 13/591,969 7 pages.
Restriction Requirement mailed Mar. 29, 2013 for U.S. Appl. No. 13/591,990, 4 pages.
Non-Final Office Action mailed Jul. 5, 2013 for U.S. Appl. No. 13/591,990, 6 pages.
Final Office Action mailed Dec. 19, 2013 for U.S. Appl. No. 13/591,990, 6 pages.
Notice of Allowance mailed Jan. 8, 2015 for U.S. Appl. No. 13/591,990, 6 pages.
Non-Final Office Action mailed Nov. 18, 2014 for U.S. Appl. No. 13/906,621, 5 pages.
Restriction Requirement mailed Jan. 29, 2015 for U.S. Appl. No. 14/097,424, 8 pgs.
Notice of Allowance mailed Feb. 3, 2015 for U.S. Appl. No. 14/042,628, 12 pages.
Non-Final Office Action mailed Feb. 12, 2015 for U.S. Appl. No. 14/097,459, 16 pages.
U.S. Appl. No. 14/042,623, filed Sep. 30, 2013, entitled "Devices and Stacked Microelectronic Packages with Parallel Conductors and Intra-Conductor Isolator Structures and Method of their Fabrication".
U.S. Appl. No. 14/042,628, filed Sep. 30, 2013, entitled "Devices and Stacked Microelectronic Packages with In-Trench Package Surface Conductors and Methods of Their Fabrication".

(56) References Cited

OTHER PUBLICATIONS

U.S. Appl. No. 14/097,424, filed Dec. 5, 2013, entitled "Devices and Stacked Microelectronic Packages with Package Surface Conductors and Methods of Their Fabrication".

U.S. Appl. No. 14/097,459, filed Dec. 5, 2013, entitled "Devices and Stacked Microelectronic Packages with Package Surface Conductors and Adjacent Trenches and Methods of Their Fabrication".

U.S. Appl. No. 13/906,621, filed May 31, 2013, entitled "Stacked Microelectronic Packages Having Sidewall Conductors and Methods for the Fabrication Thereof".

U.S. Appl. No. 14/573,519, filed Dec. 17, 2014, entitled "Microelectronic Devices with Mutli-Layer Package Surface Conductors and Methods of Their Fabrication".

Non-Final Office Action mailed Jul. 31, 2015 for U.S. Appl. No. 14/706,359, 7 pages.

Non-Final Office Action mailed Sep. 3, 2015 for U.S. Appl. No. 13/906,621, 14 pages.

Final Office Action mailed Sep. 4, 2015 for U.S. Appl. No. 14/097,459, 10 pages.

Notice of Allowance mailed Oct. 8, 2015 for U.S. Appl. No. 14/097,424, 9 pages.

* cited by examiner

STACKED MICROELECTRONIC PACKAGES HAVING SIDEWALL CONDUCTORS AND METHODS FOR THE FABRICATION THEREOF

TECHNICAL FIELD

Embodiments of the present disclosure relate generally to microelectronic packaging and, more particularly, to stacked microelectronic packages having sidewall conductors and methods for the fabrication thereof.

BACKGROUND

It is often useful to combine multiple microelectronic devices, such as semiconductor die carrying integrated circuits (ICs), microelectromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and the formation of desired electrical connections through wire bonding or flip-chip (FC) connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, biomedical devices, and other compact electronic devices. Additionally, such 3D packaging techniques enhance device performance by reducing interconnection length, and thus signal delay, between the packaged microelectronic devices.

BRIEF DESCRIPTION OF THE DRAWINGS

Embodiments of the present disclosure will hereinafter be described in conjunction with the following figures, wherein like numerals denote like elements, and.

Figure 1:
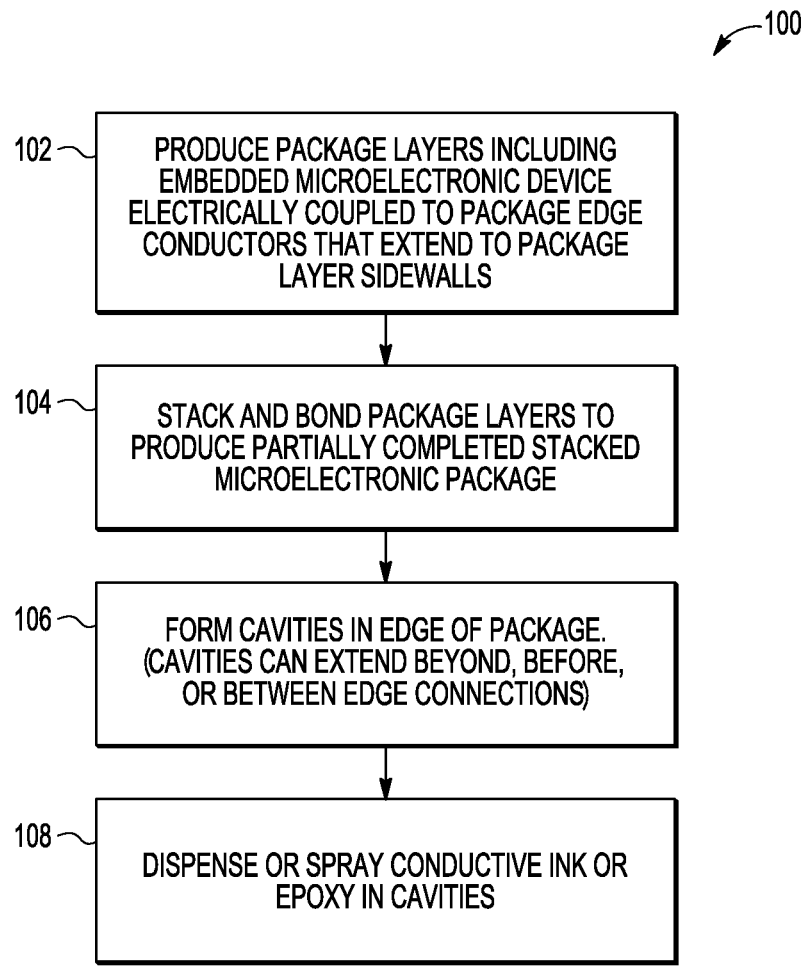
FIG. 1 is a flowchart of an embodiment of a method for fabricating a number of stacked microelectronic packages.

For simplicity and clarity of illustration, the drawing figures illustrate the general manner of construction and may omit depiction, descriptions, and details of well-known features and techniques to avoid unnecessarily obscuring the and non-limiting embodiments of the disclosure described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the disclosure.

DETAILED DESCRIPTION

The following Detailed Description is merely illustrative in nature and is not intended to limit the disclosure or the application and uses of the disclosure. Any implementation described herein as is not necessarily to be construed as preferred or advantageous over other implementations. Furthermore, there is no intention to be bound by any theory presented in the preceding Background or the following Detailed Description.

The following describes embodiments of a method for fabricating stacked microelectronic packages. Reductions in vertical package profile are achieved, at least in part, through the usage of uniquely-formed sidewall conductors, which eliminate or at least reduce the usage of BGAs or similar contact formations to interconnect overlying package layers and the microelectronic devices contained therein. Additionally or alternatively, the package sidewall conductors can be utilized to provide a convenient manner in which microelectronic devices contained within lower package layer(s) can be electrically coupled to a contact formation formed over an upper package layer. The sidewall conductors described herein provide electrically-conductive paths between package layers, and from the package topside to the package bottom, in certain embodiments, and thereby eliminate or reduce the need for through-package vias. Further, the sidewall conductors formed pursuant to the below-described fabrication method are protected from damage during subsequent manufacturing processing and transport.

FIG. 1 is a flowchart of an embodiment of a method 100 for fabricating a number of stacked microelectronic packages each including two or more microelectronic devices electrically coupled to, and possibly interconnected by, a plurality of sidewall conductors formed on the package sidewalls. As shown in FIG. 1 and described in detail below, method 100 is offered by way of non-limiting example only. It is emphasized that the fabrication steps shown in FIG. 1 can be performed in alternative orders, that certain steps may be omitted, and that additional steps may be performed in further embodiments. Furthermore, various steps in the manufacture of stacked microelectronic packages or certain components included within the microelectronic packages are well-known and, in the interests of brevity, will only be mentioned briefly herein or will be omitted entirely without providing the well-known process details. It will be appreciated that method 100 can be utilized to produce various other types of stacked microelectronic packages.

Referring to FIG. 1, method 100 begins with the production of a number of package layers in process 102. The package layers produced during process 102 of method 100 are also commonly referred to as individual "packages"; however, the phrase "package layers" is utilized predominately herein to distinguish between the package layers or packages that are stacked and interconnected to produce the completed stacked microelectronic packages and the completed microelectronic packages themselves. The completed microelectronic packages produced pursuant to the below-described method are also commonly referred to as a Package-on-Package (PoP) devices or System-in-Package (SiP) devices, depending upon the particular manner in which the completed microelectronic packages are implemented. Any method suitable for fabricating a stackable package or package layer having at least one electrically-conductive element exposed through a package sidewall and electrically coupled to microelectronic device contained within the package layer can be carried-out during process 102 of method 100.

Figure 2:
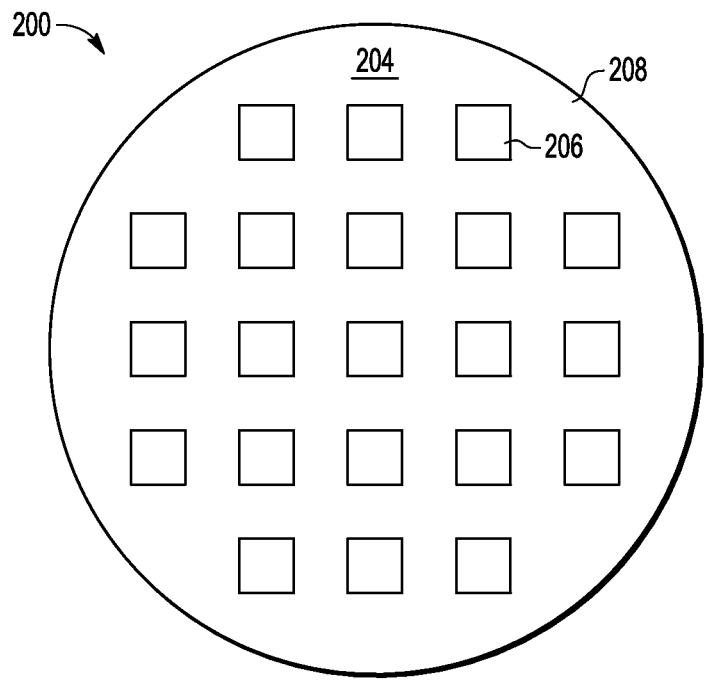
FIG. 2 is a top-down view illustrating a partially-completed microelectronic device panel 200.

FIG. 2 is a top-down view illustrating a partially-completed microelectronic device panel 200, which may be produced utilizing an redistributed chip package (RCP) process performed during process 102 of method 100 (FIG. 1). RCP device panel 200 includes a panel body 208 in which a plurality of microelectronic devices 206 are embedded. Microelectronic devices 206 may be substantially identical or may instead vary in type, function, size, etc.; e.g., certain ones of devices 206 may be a first type of device (e.g., ASIC die), while others of devices 206 may be a second type of device (e.g., MEMS devices). Devices 206 are exposed through major surface 204 of panel body 208 (referred to herein as "device surface 204"). In the illustrated example, device panel 200 includes twenty one square-shaped devices 206 arranged in a grid pattern or array; however, the number of microelectronic devices, the planform dimensions of the microelectronic devices (e.g., the die shape), and the manner in which the devices are spatially distributed within panel body 208 will vary amongst embodiments. Panel body 208 is typically produced as a relatively thin, disc-shaped body or mass having a generally circular planform geometry; however, panel body 208 can be fabricated to have any desired shape and dimensions. Panel body 208 can have a thickness equivalent to or slightly exceeding the maximum height of microelectronic devices 206 (i.e., the die height when devices 206 are semiconductor die) to minimize the overall vertical profile of the completed stacked microelectronic package.

RCP device panel 200 can be produced in following manner. First, microelectronic devices 206 are positioned in a desired spatial arrangement over the surface of a support substrate or carrier (not shown); e.g., devices 206 may be arranged over the carrier in a grid array of the type shown in FIG. 2. If desired, one or more release layers may also be applied or formed over the carrier's upper surface prior to positioning of microelectronic devices 206. A mold frame, which has a central cavity or opening therethrough, is positioned over the carrier and around the array of microelectronic devices 206. An encapsulant, such as a silica-filled epoxy, is then dispensed into the cavity of the mold frame and flows over microelectronic devices 206. Sufficient volume of the encapsulant is typically dispensed over microelectronic devices 206 to enable the encapsulant to flow over the uppermost or non-contact-bearing surfaces of devices 206. The encapsulant may then be solidified by, for example, an oven cure to yield a solid panel body in which microelectronic devices 206 are embedded. Panel body 208 may be rigid or flexible, depending upon the chosen encapsulant. Panel body 208 is then released from the carrier to reveal the backside of body 208 through which devices 206 are exposed; i.e., device surface 204 in the embodiment shown in FIG. 2. If desired, the front side of panel body 208 may be ground or polished to bring device panel 200 to a desired thickness prior to release of the panel body from the carrier. The foregoing example notwithstanding, panel body 208 can be produced utilizing various other known fabrication techniques including, for example, compression molding and lamination processes.

After encapsulation of microelectronic devices 206 within panel body 208, a plurality of package edge conductors is next fabricated over device surface 204 of RCP device panel 200. The term "package edge conductor," as appearing herein, refers to an electrically-conductive element, such as a metal trace, a wire, an interconnect line, a metal-filled trench, a bond pad, or the like, which is electrically coupled to a microelectronic device embedded within a package or package layer and which extends to a sidewall or edge portion of the package to contact a sidewall conductor, such as the sidewall conductors described below in conjunction with FIGS. 8-14. The package edge conductors can assume a wide variety of different forms and, in many embodiments, will consist of or include a number of electrically-conductive lines (e.g., metal traces), vias, metal plugs, and the like, which are formed in a number of dielectric layers (commonly referred to as a "build-up layers," "metal layers," or "redistribution layers" (RDLs)), and which collectively provide an electrically conductive path between an encapsulated microelectronic device and a package sidewall conductor formed on the package sidewall, as described below in conjunction with FIGS. 9-14.

Figure 3:
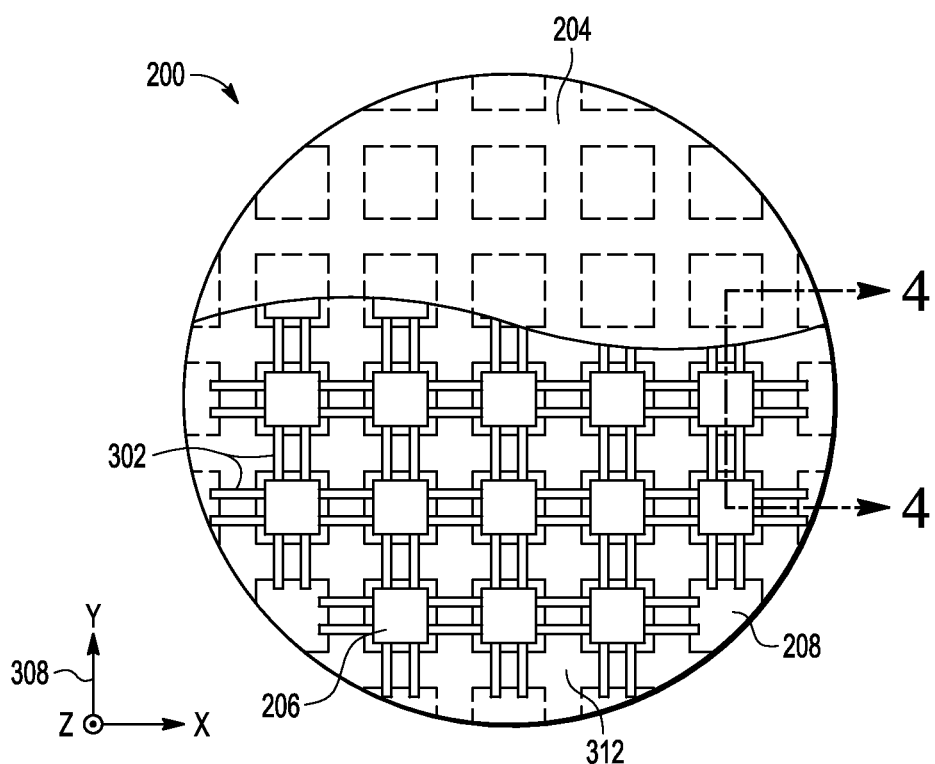
FIG. 3 illustrates an embodiment of a number of package edge conductors that can be formed during production of redistributed chip package (RCP) device panel of FIGS. 1 and 2.
Figure 4:
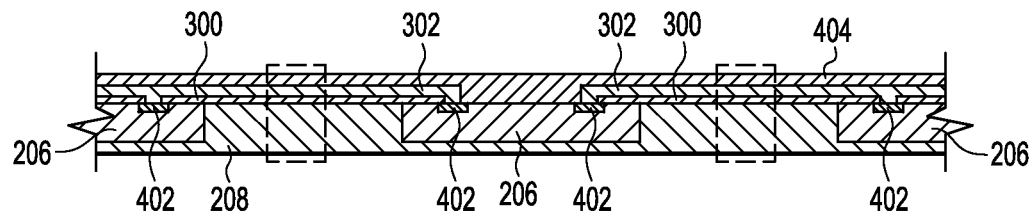
FIG. 4 further illustrates, in greater detail, a portion of the microelectronic package of FIG. 3 as taken in cross-section along line 4-4 identified in FIG. 3.

By way of non-limiting example, FIG. 3 illustrates a number of package edge conductors 302 that can be formed over device surface 204 during production of RCP device panel 200. FIG. 4 further illustrates, in greater detail, a portion of microelectronic device panel 200, as taken in cross-section along line 4-4 identified in FIG. 3. In this particular example, package edge conductors 302 assume the form of a number of interconnect lines or metal (e.g., copper) traces and can consequently also be referred to as "traces 302" hereafter. Traces 302 extend along a plane parallel with device surface 204 or, stated differently, along the x-y plane identified in FIG. 3 by coordinate legend 308. Traces 302 can be produced using bumping or wafer level packaging fabrication techniques such as sputtering, plating, jetting, or stencil printing (e.g., of an electrically-conductive ink), to list but a few examples. Traces 302 will typically be formed in one or more layers of dielectric material 300 (shown in FIG. 4 and not shown in FIG. 3 to more clearly illustrate the positioning of microelectronic devices 206 with respect to traces 302).

As may be appreciated most readily with reference to FIG. 4, package edge conductors 302 are electrically coupled to a number of landing pads or other electrical contact points 402 provided on each microelectronic device 206. Package edge conductors 302 may be electrically connected to device contact points 402 by filled vias, plated vias, metal plugs, or the like formed through the dielectric layer or layers underlying package edge conductors 302 utilizing bumping, wafer level packaging, or other known processing techniques. After formation of package edge conductors 302, one or more overlying dielectric, capping, or passivation layers 404 may be formed over package edge conductors 302 utilizing a spin-on coating process, printing, lamination, or another deposition technique.

Package edge conductors 302 extend from their respective microelectronic devices 206 to neighboring dicing streets 312, which surround or border each device 206 and which are generically represented in FIG. 3 by intersecting dashed columns and rows. Dicing streets 312 represent portions of device panel 200 located between and around devices 206, which lack electrically-active elements and along which the stacked microelectronic packages are divided during singulation. Dicing streets 312 are also commonly referred to as "saw streets"; however, the term "dicing streets" is used herein to emphasize that, while singulation can be accomplished through a mechanical sawing process, other dicing techniques can be employed to separate the microelectronic packages during singulation including, for example, laser cutting and scribing with punching. As shown in the embodiment illustrated in FIGS. 3 and 4, neighboring package edge conductors 302, which extend along aligning axes 308 (i.e., the x- or y-axis, as identified in FIG. 3), can be formed to connect or meet within dicing streets 312 and thereby form a continuous conductive line extending between neighboring microelectronic devices 206; however, this is by no means necessary as the portions of package edge conductors 302 extending into dicing streets 312 will later be removed during singulation of device panel 200, as described below in conjunction with FIG. 5.

While a single layer or level of package edge conductors or traces 302 are formed over RCP panel 200 in the example shown in FIGS. 3 and 4, multiple layers or levels of traces 302 can be formed over RCP device panel 200 in other embodiments. Furthermore, in embodiments wherein one or more of the individual package layers include multiple embedded microelectronic devices, conductors may also be formed at this juncture in the fabrication process in conjunction with the formation of package edge conductors 302, to interconnect the multiple devices included within each package layer.

Figure 5:
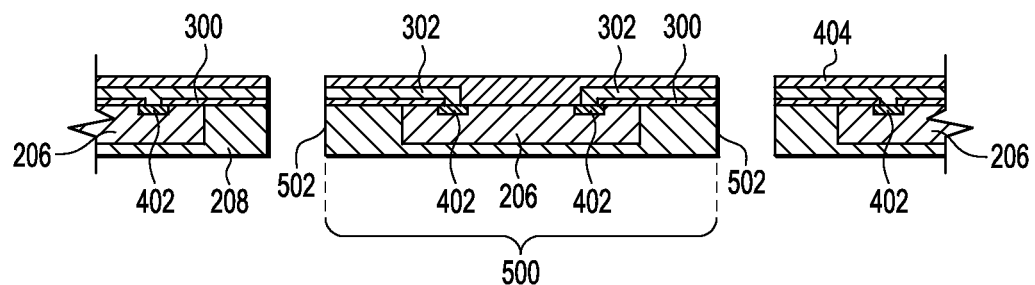
FIG. 5 illustrates, in cross-sectional view, a portion of the microelectronic device panel of FIG. 2 after singulation to yield a plurality of stacked microelectronic package layers.

RCP device panel 200 is singulated to complete production of the package layers during process 102 of method 100 (FIG. 1). As previously indicated, panel singulation can be carried-out by mechanical sawing; however, any suitable separation process can be utilized including laser cutting and scribing with punching. In one embodiment, singulation is performed utilizing a conventional dicing saw, such as a water-cooled diamond saw. FIG. 5 illustrates, in cross-sectional view, a portion of microelectronic device panel 200 after singulation to yield a plurality of stacked microelectronic package layers 500 (only one of which is fully shown and identified in FIG. 5). Each RCP package layer 500 will typically be cut to have a rectangular shape and, therefore, four vertical package edges or sidewalls 502. As package edge conductors 302 were previously formed to extend to dicing streets 312 (now removed), package edge conductors 302 extend to and are exposed through vertical sidewalls 502 of the singulated package layers 500. Package edge conductors 302 can be produced to extend to each of the four vertical package sidewalls in the below-described manner to maximize layer-to-layer connectivity of the finished packaged device; however, this is by no means necessary, and package edge conductors 302 may be fabricated to extend to any other number of package sidewalls in further embodiments.

Figure 6:
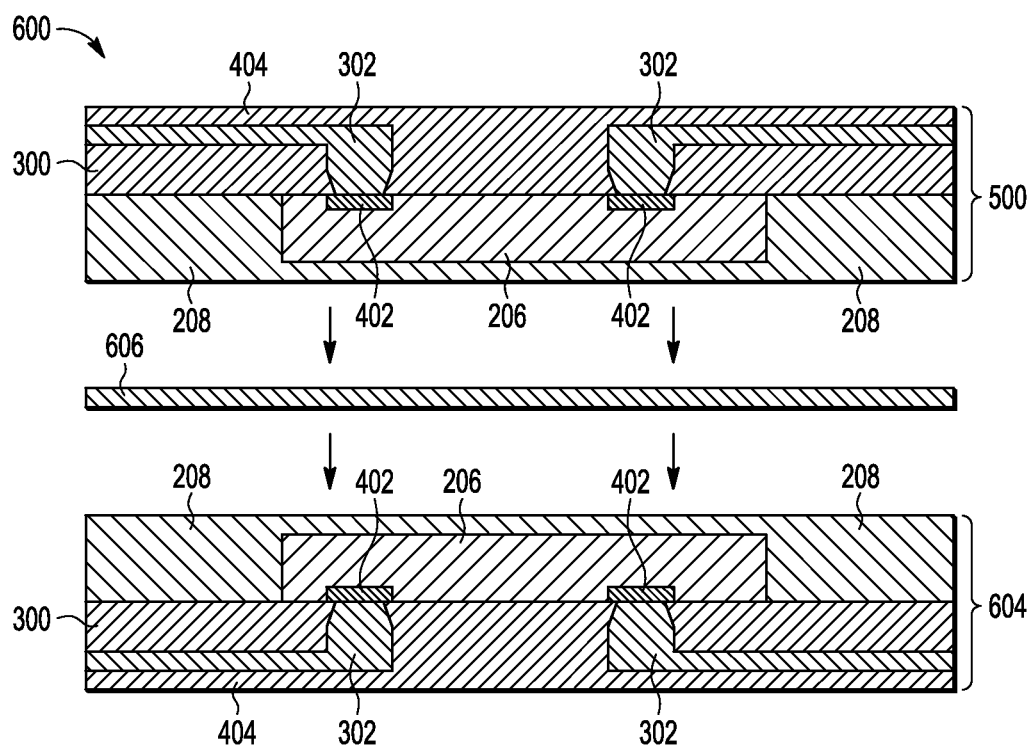
FIGS. 6-7 are exploded cross-sectional and cross-sectional views, respectively, depicting a manner which a first package layer may be positioned in stacked relationship with a second package layer to produce a partially-completed stacked microelectronic package.
Figure 7:
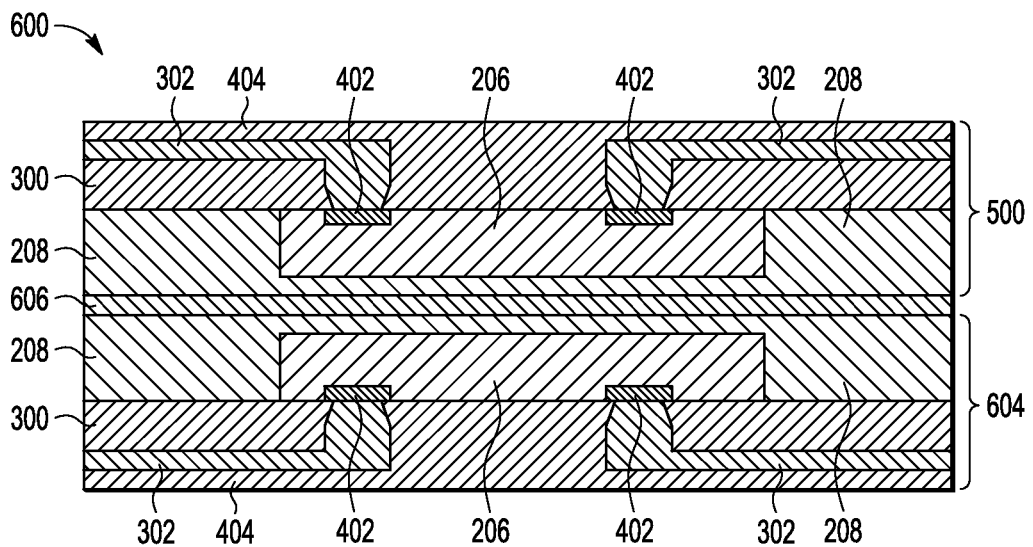

In process 104 of method 100 (FIG. 1), each singulated package layer 500 produced during process 102 is now combined with one or more additional package layers to produce partially-completed stacked microelectronic packages. Further illustrating this manufacturing step, FIGS. 6 and 7 are exploded cross-sectional and cross-sectional views, respectively, depicting a manner which RCP package layer 500 may be positioned in stacked relationship with an additional RCP package layer 604 to produce a partially-completed stacked microelectronic package 600. Any suitable number of additional device layers may also be included within partially-completed stacked microelectronic package 600. For convenience of explanation, RCP package layer 604 is illustrated and described as substantially identical to RCP package layer 500; e.g., as does package layer 500, package layer 604 includes a molded package layer body 208, one or more microelectronic devices 206 embedded in package layer body 208, and a plurality of package edge conductors 302 (e.g., metal traces) extending from devices 206 to the package sidewalls. In view of the illustrated orientation of microelectronic package 600, RCP package layer 500 will be referred to as "upper package layer 500" herein below, while RCP package layer 604 is referred to as "lower package layer 604." It should be understood, however, that this terminology is used for convenience of reference only, that the orientation of the completed stacked microelectronic package is arbitrary, and that the microelectronic package will often be inverted during later processing steps and/or when incorporated into a larger electronic system or device.

Package layers 500 and 604 (and any additional microelectronic device panels included within partially-completed stacked microelectronic package 600) can be laminated together during process 104 of method 100. As indicated in FIGS. 6 and 7, this may be accomplished by applying or otherwise positioning an intervening bonding layer 606 between microelectronic device package layers 500 and 604 prior to package stacking. Bonding layer 606 can be an epoxy or other adhesive, which may be applied over the upper surface of lower package layer 604 and thermally cured after positioning of upper package layer 500. This example notwithstanding, any suitable bonding material or means can be utilized to bond package layers 500 and 604 together including, for example, double-sided adhesive tape. By laminating microelectronic device package layers 500 and 604 together in this manner, the relative positioning of package layers 500 and 604 and, therefore, the relative positioning of the microelectronic devices 206 embedded within package layers 500 and 604 can be maintained during processing and after singulation into discrete stacked microelectronic packages. Package layers 500 and 604, and any other package layers to be included within the stacked microelectronic packages, can be tested prior to stacking to ensure that only known-good package layers are consolidated during process 104 of method 100 (FIG. 1).

In the embodiment illustrated in FIGS. 6 and 7, package layer 500 is positioned in a stacked relationship with at least one additional RCP package or package layer 604 after the additional package layer has undergone singulation and, thus, been separated from the larger device panel, such as panel 200 shown in FIGS. 2 and 3. However, in further embodiments, package layer 500 may be positioned in a stacked relationship with at least one additional RCP package layer 604 prior to singulation thereof; that is, the singulated package layer 500 and one or more other package layers 604 may be stacked or positioned over a number of additional package layers that are still interconnected as a pre-singulated device panel. After stacking the singulated packages on the non-singulated device panel, and after bonding the singulated packages to the panel in the above-described manner, the individual stacked microelectronic packages may then be separated by singulation of the panel using, for example, a dicing saw. This alternative fabrication technique likewise yields a plurality of partially-completed stacked microelectronic packages, such as stacked microelectronic package 600 shown in FIGS. 6 and 7. In still further embodiments, two or more device panels may be stacked, bonded, and then singulated to produce the partially-completed stacked microelectronic packages during process 104 of method 100 (FIG. 1). Although the example shown includes the bottom of package layer 500 bonded to the top of package layer 604, the top of package layer 500 may be bonded to the top of package layer 604, the bottom of package layer 500 may be bonded to the bottom of package layer 604, or the top of package layer 500 may be bonded to the bottom of package layer 604. The foregoing processes are all considered to constitute the stacking of microelectronic packages, whether stacking is performed utilizing multiple singulated packages, multiple non-singulated packages in the form of multiple RCP device panels, or a combination of singulated packages and one or more device panels. Manufacturing techniques wherein package stacking is performed on a partial or full panel level can facilitate the positioning and bonding of the stacked microelectronic packages thereby improving throughput while reducing manufacturing time and cost.

Figure 8:
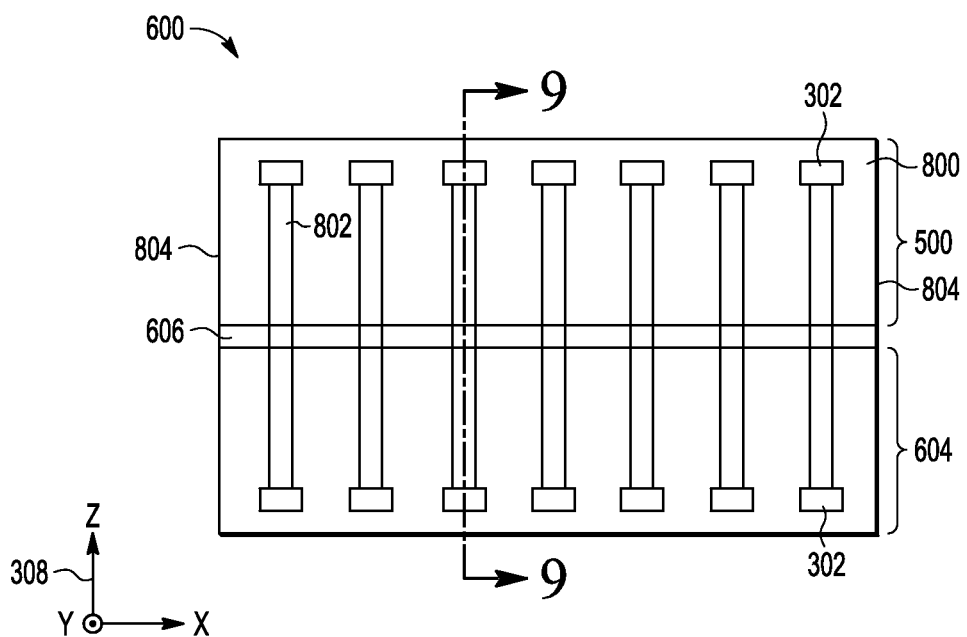
FIGS. 8-9 illustrate respective cross-sectional and side views of an embodiment of a stacked microelectronic package at an intermediate stage of manufacture in accordance with the present disclosure.

FIG. 8 is a side view of stacked microelectronic package 600 having four vertical sidewalls 804 (only two of which can be seen in FIG. 8). As should be appreciated from the foregoing description, each package layer 500 and 604 of package 800 contains at least one microelectronic device 206, which is embedded within the molded package layer body 208. Each package layer 500 and 604 further includes package edge conductors 302, which are electrically coupled to the embedded microelectronic devices and exposed through one of the vertical package sidewalls, such as package sidewall 804 identified in FIG. 8. As the below-described package sidewall conductors will often be formed to have a generally linear shape and vertical orientation, stacked microelectronic package 800 is fabricated such that the exposed terminal end of each package edge conductor 302 included within package layer 500 generally aligns with a different exposed terminal end of edge conductor 302 included within package layer 604, as taken along the centerline of package 600 or along the z-axis (identified in FIG. 8 by coordinate legend 308); however, this is not necessary in all embodiments as it is possible to form sidewall conductors having L-shaped, U-shaped, block-shaped, and other geometries interconnecting non-overlapping sidewall conductors, as well as sidewall conductors having non-vertical (e.g., slanted) orientations.

Cavities 802 for sidewall conductors are next formed on at least one of the package sidewalls 804 by removing some of the encapsulating material from sidewalls 804 of package body 800 between edge conductors 302 on layer 500 and edge conductors 302 on layer 604. Cavities 802 can be formed using a laser or other suitable technique and can have the same width as edge conductors 302, a smaller width than edge conductors 302, or larger width than edge conductors 302. Cavities 802 are typically a straight line between respective edge conductors 302 on layers 500, 604. A portion 902 (FIG. 9) of edge conductors 302 facing an inner portion of cavities 802 is exposed so that electrical contact can be made between edge conductors 302 and conductive material to be placed in cavities 802. For improved manufacturing efficiency, formation of the sidewall cavities 802 can be carried-out in parallel using more than one laser for one package 600 or a number of stacked microelectronic packages 600. As shown in the embodiment, little or no conductive material has been removed from edge conductors 302 to form cavities 802.

Figure 9:
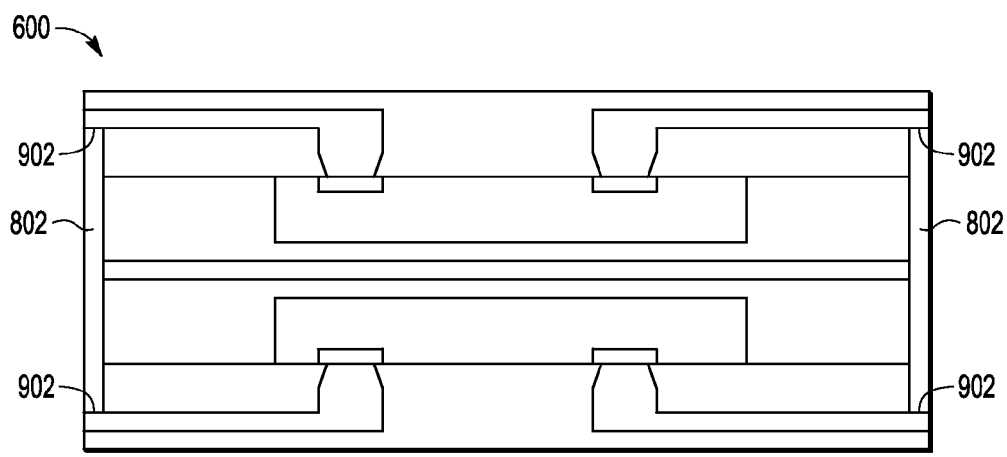
Figure 10:
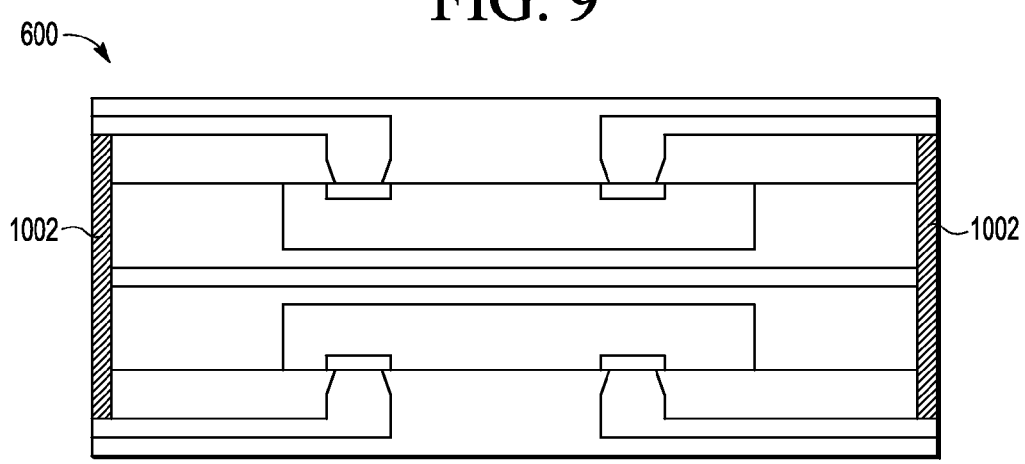
FIGS. 10-11 illustrate respective cross-sectional and side views of the stacked microelectronic package of FIGS. 8 and 9 at a subsequent stage of manufacture.
Figure 11:
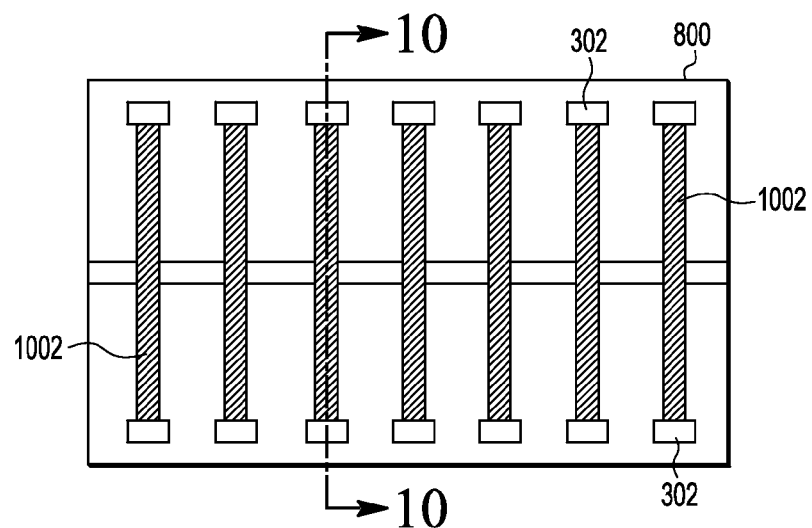
Figure 12:
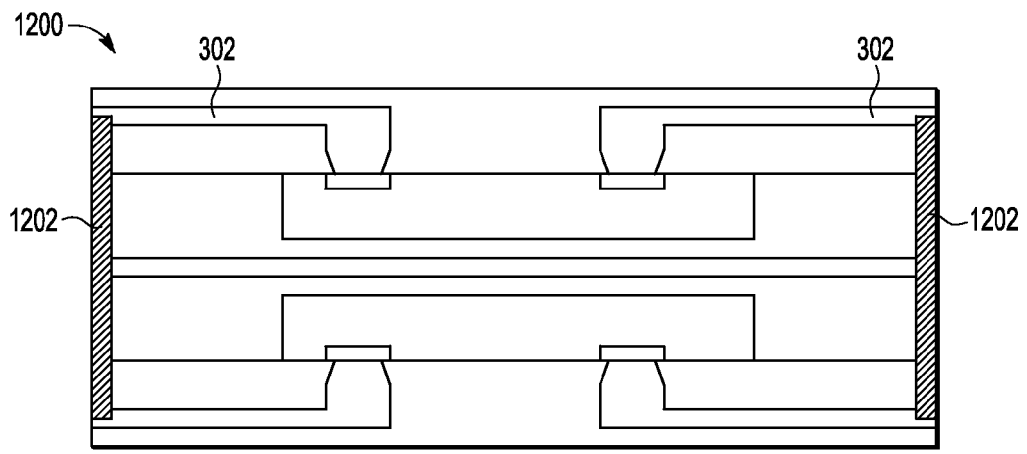
FIGS. 12-13 illustrate respective cross-sectional and side views of another embodiment of a stacked microelectronic package in accordance with the present disclosure.
Figure 13:
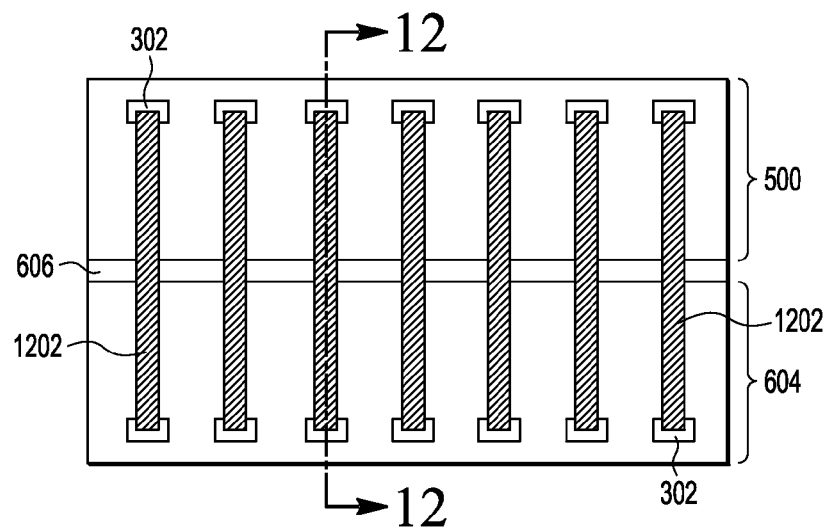
Figure 14:
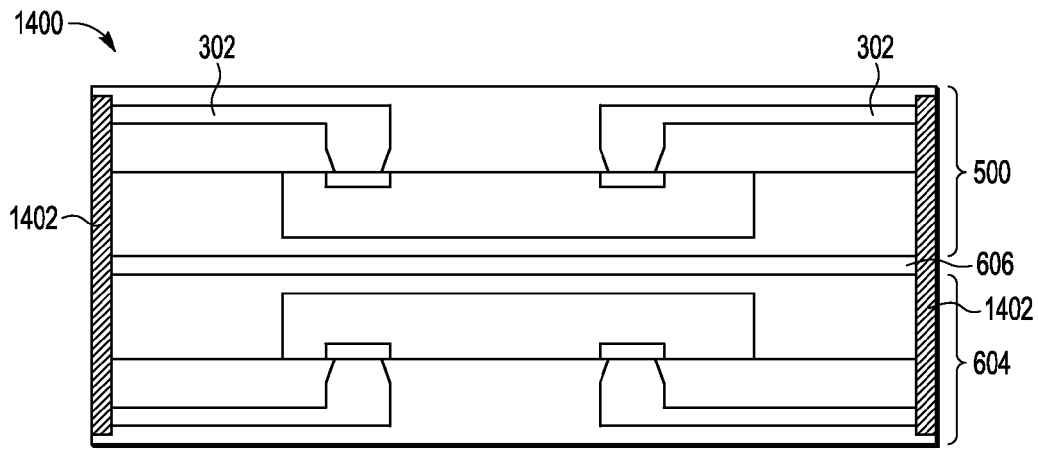
FIGS. 14-15 illustrate respective cross-sectional and side views of another embodiment of a stacked microelectronic package in accordance with the present disclosure.
Figure 15:
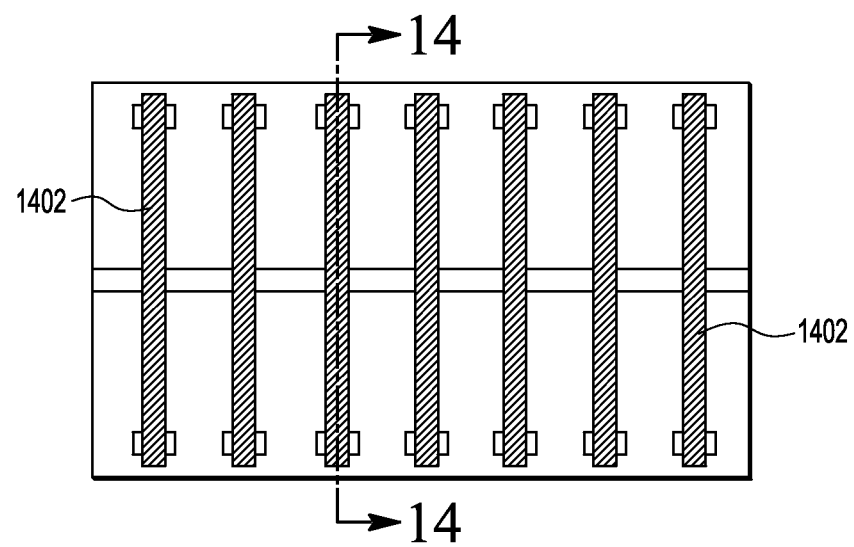

Referring to FIGS. 8-11, FIGS. 10-11 illustrate respective cross-sectional and side views of the stacked microelectronic package 600 of FIGS. 8-9 after process 108 of method 100 has been performed. Sidewall conductors 1002 are formed by placing electrically conductive material in cavities 802 and in electrical contact with exposed portions 902 of edge conductors 302. The sidewall conductors 1002 electrically couple different ones (typically pairs) of package edge conductors 302 and thereby interconnect the package layers 500, 604 and, specifically, the microelectronic devices 206 contained therein. Additionally or alternatively, the sidewall conductors 1002 may electrically couple the microelectronic device or devices 206 located in lower package levels or layers to a contact formation formed over the uppermost package level or layer.

In some embodiments, a conductive material that can be used for sidewall conductors 1002 includes electrically-conductive adhesive (ECA). Other suitable conductive materials that can be used include conductive polymer and polymers filled with conductive particles such as metals, alloys of metals, metal coated organics particles, metal coated ceramic particles, solder pastes, solder-filled adhesives, nanoparticle-filled inks, and metal-containing adhesives or epoxies, such as silver-, nickel-, and copper-filled epoxies (collectively referred to herein as "electrically-conductive pastes"). Suitable conductive materials also include low melt point metals and alloys lacking resins or fluxes and having melting points below 300° C. including, but not limited to, indium and bismuth. The conductive material can be applied in the cavities 802 by spraying, inkjet and aerosol jet, stencil printing, or other dispensing method. Notably, sidewall conductors 1002 do not extend past the sidewalls of the cavities 802 and thus remain within the overall dimensions of package 600. Since sidewall conductors 1002 are contained fully within cavities 802, there is less chance that sidewall conductors 1002 will be damaged from external bumps with other components during subsequent manufacturing processes or while in transit.

Referring to FIGS. 8-9 and 12-13, FIGS. 12-13 illustrate respective cross-sectional and side views of another embodiment of a stacked microelectronic package 1200 in accordance with the present disclosure in which sidewall conductors 1202 extend to an intermediate location over edge conductors 302. While the cavities 802 (FIG. 8) are being made, a portion of edge conductors 302 is removed along with a portion of the encapsulant and bonding layer 606 of package body 800 between respective edge conductors 302. A portion of the edge conductors 302 are thus part of cavities 802.

Referring to FIGS. 8-9 and 14-15, FIGS. 14-15 illustrate respective cross-sectional and side views of another embodiment of a stacked microelectronic package 1400 in accordance with the present disclosure in which sidewall conductors 1402 extend beyond edge conductors 302. While the cavities 802 (FIG. 8) are being made, a portion of edge conductors 302 is removed along with a portion of the encapsulant and bonding layer 606 of package body 800 between and beyond respective edge conductors 302. A portion of the edge conductors 302 are thus part of cavities 802. In some cases, sidewall conductors 1402 can extend over an adjacent surface, such as the top and/or bottom surface of package 1400.

Figure 16:
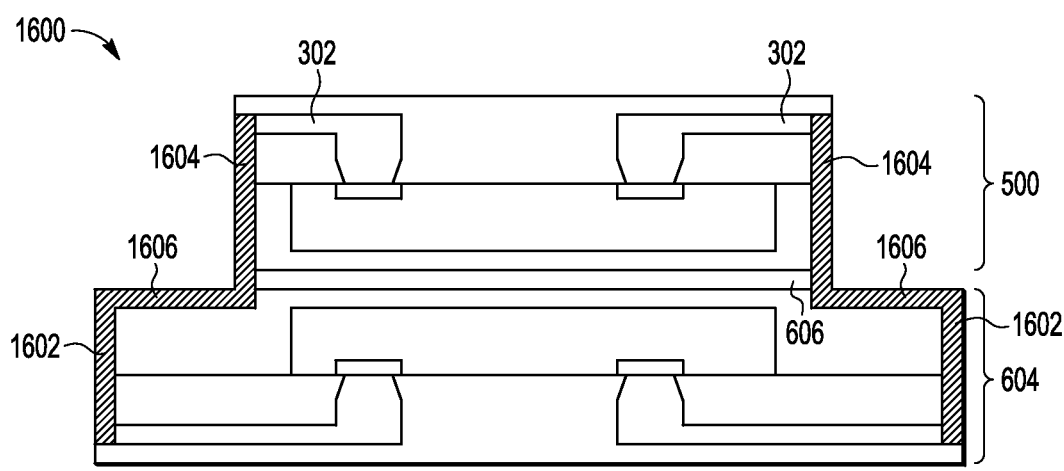
FIG. 16 shows an embodiment of stacked semiconductor having a first package layer with a smaller planform geometry than a second package layer.

Referring to FIGS. 8-9 and 16, FIG. 16 shows an embodiment a first package layer 500 is shown that has a smaller planform geometry than second package layer 604. Sidewall conductors 1602-1606 can be formed in a stair step configuration with sidewall conductors 1602, 1604 that rise along the sidewalls of each layer 500, 604 and sidewall conductor 1606 that forms a runs portion across the top or major surface of layer 604 between sidewall conductors 1602 and 1604.

One or more lasers can be used to remove the portion of the edge conductors 302, encapsulant, and bonding layer 606, as well as a portion of encapsulant material along the top or bottom surface of layer 500 and/or 604, as required for packages 1200, 1400 and 1600.

Note that combinations of edge conductors 302 and sidewall conductors 1002, 1202, 1402, and 1602-1606 can be included in the same microelectronic package. Additionally different ends of sidewall conductors 1002, 1202, 1402 1602, 1604 can extend to different lengths between, overlapping, or beyond edge conductors 302.

By now it should be appreciated that in some embodiments, a method for fabricating stacked microelectronic packages can comprise providing a stacked microelectronic package including a package body having an external vertical package sidewall, a plurality microelectronic devices embedded within the package body, and package edge conductors electrically coupled to the plurality of microelectronic devices and extending to the external vertical package sidewall. A cavity is formed on an external surface of the package body between a first one of the package edge conductors and a second one of the package edge conductors. The cavity is filled with electrically conductive material.

In another aspect, the plurality of sidewall conductors are formed to electrically couple the plurality of microelectronic devices embedded within the package body.

In another aspect, the plurality of microelectronic devices can comprise a first microelectronic device and a second microelectronic device located in different levels of the package body. The plurality of sidewall conductors can be formed to electrically couple the first microelectronic device to the second microelectronic device.

In another aspect, the cavity can be formed between the first and second one of the package edge conductors and the conductive material is in contact with the first and second ones of the package edge conductors.

In another aspect, forming the cavity can include removing a portion of the first and second one of the package edge conductors.

In another aspect, the forming the cavity includes extending the cavity beyond at least one of the first and second one of the package edge conductors.

In another aspect, forming the cavity can include extending the cavity to an intermediate location over at least one of the first and second one of the package edge conductors.

In another aspect, the cavity can be formed in a step configuration that includes a run portion over a major surface of one of the levels of the package body, the run portion extending between and in contact with the external vertical package sidewall of a first level of the different levels and the external vertical package sidewall of a second level of the different levels.

In another aspect, the conductive material in the cavity can be within planform dimensions of the microelectronic package.

In another aspect, the conductive material can comprise one of a group consisting of: an electrically conductive adhesive, conductive polymer, a polymer filled with conductive particles, a metal alloy, metal coated organic particles, metal coated ceramic particles, solder paste, solder-filled adhesive, nanoparticle-filled ink, a metal-containing adhesive, a metal-containing epoxies, electrically-conductive pastes, indium, and bismuth.

In other embodiments, a stacked microelectronic package can comprise a package body having an external vertical package sidewall, a plurality of microelectronic devices embedded within the package body, and package edge conductors electrically coupled to the plurality of microelectronic devices and extending to the external vertical package sidewall. A cavity is formed on an external surface of the package body between a first one of the package edge conductors and a second one of the package edge conductors. Electrically conductive material is in the cavity and in electrical contact with a first and a second one of the package edge conductors, wherein the conductive material in the cavity is within planform dimensions of the microelectronic package.

In another aspect, the plurality of sidewall conductors can be formed to electrically couple the plurality of microelectronic devices embedded within the package body.

In another aspect, the plurality of microelectronic devices can comprise a first microelectronic device and a second microelectronic device located in different levels of the package body, and wherein the plurality of sidewall conductors are formed to electrically couple the first microelectronic device to the second microelectronic device.

In another aspect, the cavity can be formed in a step configuration that includes a run portion over a major surface of one of the levels of the package body, the run portion extending between and in contact with the external vertical package sidewall of a first level of the different levels and the external vertical package sidewall of a second level of the different levels.

In another aspect, a portion of the first and second one of the package edge conductors form part of the cavity.

In another aspect, the cavity extends beyond at least one of the first and second one of the package edge conductors.

In another aspect, the cavity extends to an intermediate location over at least one of the first and second one of the package edge conductors.

In still other embodiments, a stacked microelectronic package can comprise a package body having external vertical package sidewall, a first microelectronic device embedded within a first level of the package body, a second microelectronic device embedded within a second level of the package body, a first package edge conductor electrically coupled to the first microelectronic device and extending to the external vertical package sidewall, and a second package edge conductor electrically coupled to the second microelectronic device and extending to the external vertical package sidewall. A cavity can be formed on an external surface of the package body between the first package edge conductor and the second package edge conductor. Electrically conductive material is in the cavity and in electrical contact with the first and a second one of the package edge conductors.

In another aspect, the sidewall conductor is formed to electrically couple the first and second microelectronic devices embedded within the package body.

In another aspect, the cavity can be formed in a step configuration that includes a run portion over a major surface of one of the levels of the package body, the run portion extending between and in contact with the external vertical package sidewall of a first level of the different levels and the external vertical package sidewall of a second level of the different levels.

Embodiments of the above-described fabrication methods can also be described as providing electrically conductive circuit lines (referred to above as "sidewall conductors" or "sidewall interconnects") at the edge of stacked microelectronic packages.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the disclosure are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

As appearing herein, the term "microelectronic device" is utilized in a broad sense to refer to an electronic device, element, or component produced on a relatively small scale and amenable to packaging in the below-described manner. Microelectronic devices include, but are not limited to, ICs formed on semiconductor die, MEMS, passive electronic components, optical devices, and other small scale electronic devices capable of providing processing, memory, sensing, radiofrequency, optical, and actuator functionalities, to list but a few examples. The term "microelectronic package" denotes a structure or assembly containing at least one and typically two or more microelectronic devices, which may or may not be interconnected. The term "stacked microelectronic package" refers to a microelectronic package containing at least two microelectronic devices located within different levels or overlying layers of the microelectronic package. Finally, the term "stacked microelectronic devices" is utilized to collectively refer to two or more microelectronic devices, which are located on different levels of a stacked microelectronic package, as defined above. The term "stacked microelectronic devices" thus does not require that one microelectronic device is necessarily positioned directly above or beneath another.

While at least one embodiment has been presented in the foregoing Detailed Description, it should be appreciated that a vast number of variations exist. It should also be appreciated that the embodiment or embodiments are only examples, and are not intended to limit the scope, applicability, or configuration of the disclosure in any way. Rather, the foregoing Detailed Description will provide those skilled in the art with a convenient road map for implementing embodiments of the disclosure. It being understood that various changes may be made in the function and arrangement of elements described in an embodiment without departing from the scope of the disclosure as set-forth in the appended claims.

What is claimed is:

1. A stacked microelectronic package, comprising:
    a molded package body having an external vertical package sidewall;
    a plurality of singulated microelectronic devices embedded within the molded package body
    package edge conductors electrically coupled to the plurality of microelectronic devices and extending to the external vertical package sidewall;
    a cavity formed in an external surface of the molded package body between a first one of the package edge conductors and a second one of the package edge conductors; and
    electrically conductive material in the cavity and in electrical contact with a first and a second one of the package edge conductors, wherein the conductive material in the cavity is within planform dimensions of the microelectronic package and sidewalls of the cavity cover all side edges of the electrically conductive material.

2. A stacked microelectronic package according to claim 1 wherein the package edge conductors are formed to electrically couple the plurality of microelectronic devices embedded within the molded package body.

3. A stacked microelectronic package according to claim 1 wherein the plurality of microelectronic devices comprises a first microelectronic device and a second microelectronic device located in different levels of the molded package body, and wherein the package edge conductors are formed to electrically couple the first microelectronic device to the second microelectronic device.

4. A stacked microelectronic package according to claim 3 wherein the cavity is formed in a step configuration that includes a run portion over a major surface of one of the levels of the molded package body, the run portion extending between and in contact with the external vertical package sidewall of a first level of the different levels and the external vertical package sidewall of a second level of the different levels.

5. A stacked microelectronic package according to claim 1 wherein a portion of the first and second one of the package edge conductors form part of the cavity.

6. A stacked microelectronic package according to claim 5 wherein the cavity extends beyond at least one of the first and second one of the package edge conductors.

7. A stacked microelectronic package according to claim 5 wherein the cavity extends to an intermediate location over at least one of the first and second one of the package edge conductors.

8. A stacked microelectronic package, comprising:
    a molded package body having an external vertical package sidewall;
    a first singulated microelectronic device embedded within a first level of the molded package body;
    a second singulated microelectronic device embedded within a second level of the molded package body;
    a first package edge conductor electrically coupled to the first microelectronic device and extending to the external vertical package sidewall, and a second package edge conductor electrically coupled to the second microelectronic device and extending to the external vertical package sidewall;
    a cavity formed in an external surface of the molded package body between the first package edge conductor and the second package edge conductor; and
    electrically conductive material in the cavity and in electrical contact with the first and second package edge conductors, wherein sidewalls of the cavity overlap all side edges of the electrically conductive material.

9. A stacked microelectronic package according to claim 8 wherein the first and second package edge conductors are formed to electrically couple the first and second microelectronic devices embedded within the molded package body.

10. A stacked microelectronic package according to claim 3 wherein the cavity is formed in a step configuration that includes a run portion over a major surface of one of the levels of the molded package body, the run portion extending between and in contact with the external vertical package sidewall of a first level of the different levels and the external vertical package sidewall of a second level of the different levels.

11. A stacked microelectronic package, comprising:
a molded package body having an external vertical package sidewall, a plurality of singulated microelectronic devices embedded within the molded package body, and package edge conductors electrically coupled to the plurality of microelectronic devices and extending to the external vertical package sidewall;
a cavity in an external surface of the molded package body between a first one of the package edge conductors and a second one of the package edge conductors, wherein the cavity is filled with electrically conductive material and top, bottom and side edges of the electrically conductive material are covered by the cavity.

12. A stacked microelectronic package as claimed in claim 11 wherein the first and second one of the package edge conductors are formed to electrically couple the plurality of microelectronic devices embedded within the molded package body.

13. A stacked microelectronic package as claimed in claim 11 wherein the plurality of microelectronic devices comprises a first microelectronic device and a second microelectronic device located in different levels of the molded package body, and wherein the first and second one of the package edge conductors are formed to electrically couple the first microelectronic device to the second microelectronic device.

14. A stacked microelectronic package as claimed in claim 11 wherein the cavity is formed between the first and second one of the package edge conductors and the conductive material is in contact with the first and second ones of the package edge conductors.

15. A stacked microelectronic package as claimed in claim 11 wherein the cavity is formed by removing a portion of the first and second one of the package edge conductors.

16. A stacked microelectronic package as claimed in claim 15 wherein the cavity is formed by extending the cavity beyond at least one of the first and second one of the package edge conductors.

17. A stacked microelectronic package as claimed in claim 15 wherein the cavity is formed by extending the cavity to an intermediate location over at least one of the first and second one of the package edge conductors.

18. A stacked microelectronic package as claimed in claim 13 wherein the cavity is formed in a step configuration that includes a run portion over a major surface of one of the levels of the molded package body, the run portion extending between and in contact with the external vertical package sidewall of a first level of the different levels and the external vertical package sidewall of a second level of the different levels.

19. A stacked microelectronic package as claimed in claim 18 wherein the conductive material in the cavity is within planform dimensions of the microelectronic package.

20. A stacked microelectronic package as claimed in claim 11 wherein the conductive material comprises one of a group consisting of: an electrically conductive adhesive, conductive polymer, a polymer filled with conductive particles, a metal alloy, metal coated organic particles, metal coated ceramic particles, solder paste, solder-filled adhesive, nanoparticle-filled ink, a metal-containing adhesive, a metal-containing epoxies, electrically-conductive pastes, indium, and bismuth.

\* \* \* \* \*